(12) United States Patent
Warnes et al.

(10) Patent No.: US 8,020,053 B2
(45) Date of Patent: Sep. 13, 2011

(54) ON-LINE MEMORY TESTING

(75) Inventors: Lidia Warnes, Roseville, CA (US);
Siamak Tavallaei, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 315 days.

(21) Appl. No.: 12/260,917

(22) Filed: Oct. 29, 2008

(65) Prior Publication Data
US 2010/0107010 A1    Apr. 29, 2010

(51) Int. Cl.
*G11C 29/00* (2006.01)
(52) U.S. Cl. ........................................ 714/718
(58) Field of Classification Search .................. 714/718, 714/36, 42, 733, 734, 30, 47.2, 39, 47.1, 714/799; 365/185.33
See application file for complete search history.

(56) References Cited

U.S. PATENT DOCUMENTS

| | | | | |
|---|---|---|---|---|
| 4,255,808 A | * | 3/1981 | Schaber | 714/764 |
| 4,460,998 A | * | 7/1984 | Yamada et al. | 714/711 |
| 4,475,194 A | * | 10/1984 | LaVallee et al. | 714/710 |
| 4,590,586 A | * | 5/1986 | Zenk et al. | 711/151 |
| 4,648,065 A | * | 3/1987 | Zenk et al. | 711/151 |
| 6,216,226 B1 | * | 4/2001 | Agha et al. | 713/2 |
| 6,545,921 B2 | | 4/2003 | Ohtani et al. | |
| 7,107,493 B2 | | 9/2006 | Nguyen et al. | |
| 7,188,282 B2 | * | 3/2007 | Walmsley | 714/718 |
| 7,865,710 B2 | * | 1/2011 | Thomas et al. | 713/2 |

\* cited by examiner

*Primary Examiner* — Phung M Chung

(57) ABSTRACT

A method of testing on-line and spare memory is disclosed. Such memory may currently store in-use data at some addresses. The testing is initiated upon an occurrence of a pre-selected condition. An address range is determined that excludes at least the addresses currently storing functional data. The address range is subjected to a test pattern, and errors in the address range are reported.

20 Claims, 2 Drawing Sheets

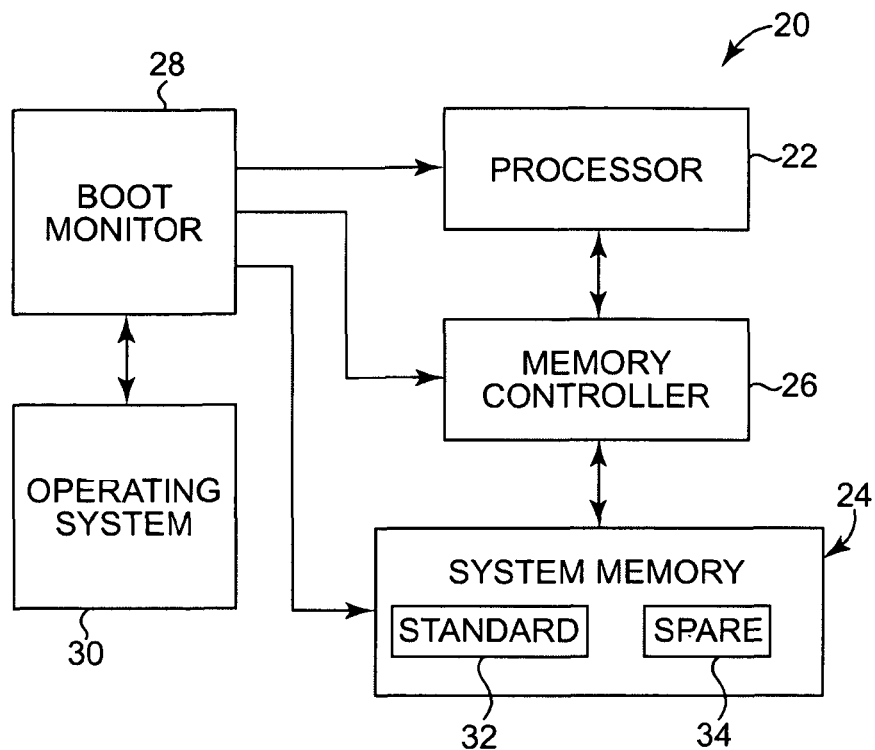
Fig. 1
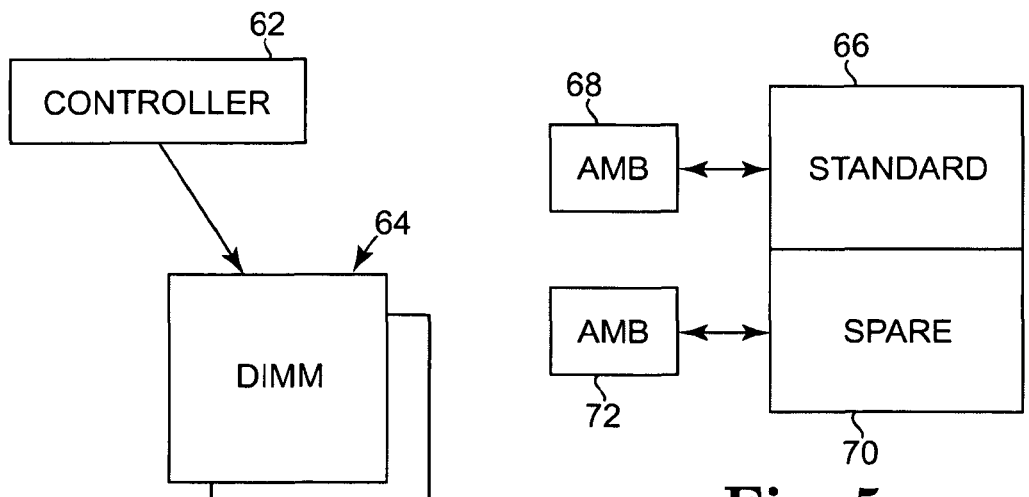
Fig. 4
Fig. 5

ON-LINE MEMORY TESTING

BACKGROUND

Memory devices such as DRAMs may occasionally encounter errors and pose problems for computing platforms when writing to or reading from faulty memory cells. Reading bad data from a faulty memory cell causes problems such as a system crash and result in system downtime. DRAM errors may include single- or multi-bit hard errors or transient soft errors. As the silicon feature sizes used to develop memory devices decrease, and as the operating frequency and steady state operating temperature of memory devices increase, these errors become more frequent and cause accumulation of faulty memory cells. These memory errors can occur at any time such as after installing the memory device into the computing platform, at boot time, and while the memory device is operating in an on-line system.

To reduce system down time due to memory errors, several methods have been used to protect against faulty memory cells. These methods include algorithms such as error correction code (ECC), memory scrubbing, and adding redundant memory through memory mirroring, memory RAID, or memory sparing.

The method of using redundant memory requires healthy memory for both active and redundant regions. The health of memory is tested at each startup (boot) time. Such a rigorous memory test is destructive because it overwrites memory cells contents. Volatile memory such as DRAM does not contain useful data at startup, the destructive memory testing is inconsequential. In the normal practice, such destructive memory testing is not performed on the on-line volatile memory or while the computing platform is in operation.

In the absence of these tests, the errors that occur in the memory subsystem during normal operation remain hidden until a Read access from the failed memory location. At that time, if memory scrubbing is enabled, if the memory error is correctable, and if the error is transient, the system can restore its health by replacing the corrupted data with corrected data. In present practice however, memory scrubbing is enabled only for the active memory regions and does not protect the spare memory.

The spare memory is used to recover from a serious uncorrectable memory failure in the active memory regions. Therefore, after boot time, in the absence of any spare memory testing, the system can detect errors in the spare memory region only in response to excessive failures detected in the active memory regions. Such latent detection of failures can prevent the system from taking advantage of the redundant spare memory and leads to a premature system crash.

BRIEF DESCRIPTION OF THE DRAWINGS

FIG. 1 is a block diagram of an example environment of the present disclosure.

FIG. 4 is a block diagram of an example of the present disclosure.

FIG. 5 is a block diagram of another example of the present disclosure.

DETAILED DESCRIPTION

Figure 2:
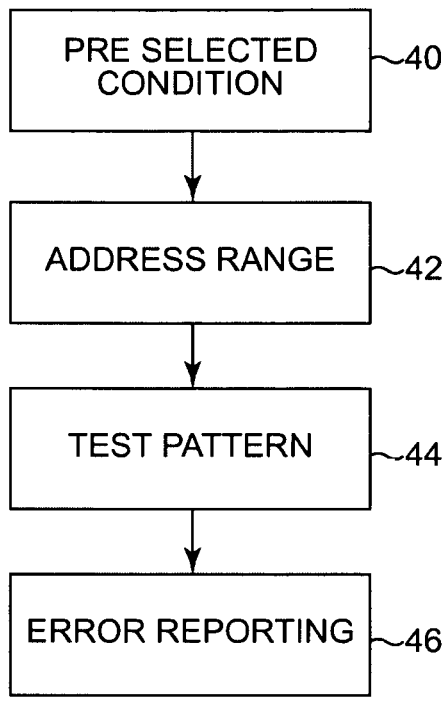
FIG. 2 is a flow diagram of an example test of the present disclosure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

FIG. 1 illustrates an example computing platform 20 that can provide an environment of the present disclosure. The computing platform 20 can be any one of a number of electronic devices such as computers, servers, network devices, appliances such as mobile phones, smart phones, and the like. The computing platform 20 includes component hardware, such as a processor 22 and a system memory 24. The processor 22 interfaces with the system memory 24, and vice versa, through a memory controller 26, which is another piece of component hardware. The computing platform 20 include one or more memory controllers 26 each interfacing with one or more sets of memory 24. The platform 20 in this example includes a boot loader or boot monitor 28 that recognizes and controls the component hardware. For example, the boot monitor 28 runs a firmware code at power-up and begins a process known as "booting," or "booting up," the computing platform 20.

The primary function of the boot monitor is to identify and initiate the component hardware and to prepare the computing platform 20 so other software programs such as the operating system 30 can load, execute, and take control of the computing platform 20. In many examples, the boot monitor 28 is a firmware code embedded on an integrated circuit chip on the computing platform. An example computing platform is personal computer and an example of the boot monitor 28 is BIOS (Basic Input/Output System) common in many personal computers, although other examples of boot monitors are legion. BIOS is one example of a boot monitor, and its primary function is called a Power On Self Test (POST).

As part of the booting process, the boot monitor 28 initializes the memory controller 26 and the system memory 24. In the example, the system memory 24 includes random access memory (RAM) of the computing platform. During the booting process, the boot monitor operates a state machine known as a Memory Built in Self Test, or MEMBIST, to test the system memory for errors and to report those errors to the operating system 30 or the like, so as not to try to write to or read from the memory locations with the errors.

The system memory 24 in one example of the above architecture includes a volatile memory. Many examples of volatile memory are possible in the above example. Often, the memory module can be arranged in discreet elements, such as in integrated circuit chips. The IC chips can further be arranged in a fashion as on a printed circuit board and called a memory module. In applying this structure to a known arrangement of memory, an example of volatile memory is random access memory, or RAM. An example of RAM is dynamic random access memory, or DRAM. The DRAMs can be manufactured as IC chips, and a collection of chips is a memory module and can be on a printed circuit board such as an in-line memory module.

One example of a memory module is a dual in-line memory module, or a DIMM. A DIMM includes a series of dynamic random access memory integrated circuits. These modules are mounted on a printed circuit board and designed for use with computing platforms 20 such as in personal computers. DIMMs are designed with a 64 bit data path and 8 bit error correcting code (ECC), which can be optional. DIMMs are logically organized and accessed in terms of ranks.

The number of ranks on any DIMM is the number of independent sets of DRAMs that can be accessed simultaneously for the full data bit-width of the DIMM to be driven on a memory bus in the computing platform 20. In one example, on a single rank DIMM that has 64 data bits of input/output pins, there is only one set of DRAMs that are turned on to drive a read or receive a write on all 64-bits. In another example, a 64-bit DIMM with two ranks would be two sets of DRAMs that could be accessed at different times. For DIMMs which have more than one rank, the rank selection is done with the aid of signals which are called chip-select. A DIMM with more than one rank can have a plurality of electrical loads on each data line. While DIMMs are commonly manufactured with up to four ranks per memory module, other organizations are possible.

Memory controller 26 contains the logic necessary to read from and write to the system memory 24, and also to refresh DRAMs at the JEDEC (Joint Electrode Devices Engineering Council) specified refresh rates. Reading and writing to system memory 24 is facilitated by the use of other supporting devices that can be part of the chipset or part of the DIMM. For example, the address/control information is distributed on a registered DIMMs (R-DIMMs) with the help of address/control registers. On fully-buffered DIMMs (FB-DIMMs), the data, address and control information is transferred between the memory controller and the DRAMs with the help of an advanced memory buffer (AMB). Other devices like data and address/control multiplexers can be used as well.

A memory rank in these example computing platforms represents all the DRAMs that are selected by the memory controller 26 for a read, write, refresh, or the other memory transaction. In cases where a DIMM channel represents all of the DIMMs that are connected to the same data bits, a memory rank can be contained on one DIMM if the memory controller drives one DIMM channel at a time or it can be spread across two, three, or four DIMMs if the memory controller 26 drives two, three, or four DIMM channels, respectively, in lockstep. This example can provide for one to four DIMMs per channel and up to sixteen ranks per memory controller when quad-ranked DIMMs are used.

A DIMM can be unbuffered or buffered. In a computing platform 20 having an unbuffered DIMM with volatile system memory 24, the memory controller 26 accesses the system memory 24 directly. Buffered system memory 24 caches or stores and forwards read and write data to a memory buffer (not shown) operably disposed between memory controller 26 and the nonvolatile memory. The memory buffer can be located on the memory module. The memory controller 26 does not write to or read from the memory module directly; rather it does that via the memory buffer. The buffer can compensate for signal deterioration by buffering and resending the signal. In addition, the buffer can also offer error correction, without posing any overhead on the processor or the memory controller. Several types of memory buffers are suitable for use in this disclosure, and two current examples that are pointed out here for illustration include registered memory modules and an advanced memory buffers.

Registered memory modules have a register between the DRAM modules and the memory controller 26 in the address and control path. Registered memory modules can place relatively smaller electrical loads on the memory controller 26 and allow single systems to remain stable with more memory modules than they can without registers. Registered memory modules are often found on computing platforms where there is a desire for scalability and stability such as in servers. Each read or write is buffered for one cycle between the memory bus and the DRAM, so the registered RAM can be thought of as running one clock cycle "behind" an equivalent unregistered DRAM.

Fully Buffered DIMM architecture introduces an Advanced Memory Buffer (AMB) between the memory controller and the memory module. Unlike the parallel bus architecture of many DRAMs, an FB-DIMM has a serial interface between the memory controller and the AMB. This enables an increase to the bandwidth of the memory without increasing the pin count of the memory controller beyond a feasible level. Also, the memory controller can perform reads and writes in parallel. In an example of the Fully Buffered DIMM architecture, a DIMM channel represents all of the DIMMs that are connected to the same data bits in southbound and northbound lanes. (In some examples, southbound lanes are the dedicated command and write lines, and northbound lanes are the lines from the DIMM to the memory controller 26.)

In many platforms 20, the memory controller 26 or memory buffer includes memory built-in self test (MEMBIST or MBIST) capabilities. The controllers 26 can select one or more tests to stress the memory 24 attached to the controller 26. Alternatively, a MEMBIST included in the boot monitor 28 or elsewhere on the platform 20 can be used to test the memory 24 if the controller 26 does not include any MEMBIST. In one example, the MEMBIST subjects the memory 24 to a stressful data pattern and reports the addresses or locations of any failed memory cells. A stressful data pattern can be described as known sequences of bytes that can adversely affect certain features of the test subject, in this case the memory 24. The MEMBIST is a destructive test meaning that the test will change the contents of all the tested memory locations.

To increase system reliability, the system memory 24, is designated to include a standard memory 32 and a spare memory 34. Total physical memory consists of both the standard memory and the spare memory. Standard memory is the logical memory that is available to the operating environment to perform the typical functions such as in a computing platform. For example, the boot monitor 28 can copy itself into the standard memory 32 after booting and operate from there if desired. Also, the operating system and specific application data can be stored in the standard memory 32. The spare memory is set aside after initialization of the total memory, and is a form of redundant memory. If an error occurs in the standard memory, the controller or buffer can replace a portion of the standard memory with the spare memory and store data into the spare memory instead. To prevent a potential system crash, the spare memory 34 is used to copy the data from an active memory region 32 that has reached a preselected error threshold. This feature is known as a memory copy operation.

In one example, the spare memory 34 is configured from the total memory as a spare DIMM or spare rank to readily operate with the memory controller 26 without having to reconfigure the data bit width. The spare DIMM or rank is used to copy the data from a corresponding standard DIMM or rank that has reached its predefined error threshold. At boot time, as part of the memory initialization, the spare memory 34 is configured at the same time as the standard memory 32. MEMBIST is used during booting up and initializing before the firmware, operating system, or application data are loaded into the standard memory 32 or the spare memory 34; thus, memory cell content destruction due to MEMBIST is of no consequence. The spare memory 34, such as the spare DIMM or spare rank does not contain the firmware, operating system, or application data, MEMBIST can be used to test the spare memory 34 while the computing platform 20 is operating and the memory is on-line.

FIG. 2 illustrates testing memory while the system memory 24 is on-line. Testing begins with a predetermined event or pre-selected condition (a trigger) indicating the test is to be performed 40. An address range of the memory to be tested is determined 42. At this time, although initialized, the spare memory has not been used by the system and does not contain operating system or application data. The test applies a pre-defined suitable test pattern to the memory 44. Any errors discovered during the test are reported 46 so the platform 20 knows not to try to write to (or read from) the memory locations containing errors.

One of several pre-selected conditions can initiate the test. For example, the test may periodically run based on a pre-scribed service policy every hour, day, or week, for example, that the memory is on-line or the platform is operated since booting up. In another example, the test may be initiated upon a determination that at least a part of the standard memory 32 is at or approaching its error threshold. In still another example, the test may be initiated before every copy operation.

In one example, the address range of the memory to be tested includes all or part of the spare memory 34. In many cases, the memory controller or buffer will contain the MEMBIST to be used on the spare memory, so the address range can be suited to the memory controller or buffer, such as by testing a spare DIMM or rank at a time, or multiple DIMMs or ranks at a time to provide for speed and efficiency. The test data can be selected from one of the stressful data patterns provided with the MEMBIST, or another stressful data pattern can be provided.

Figure 3:
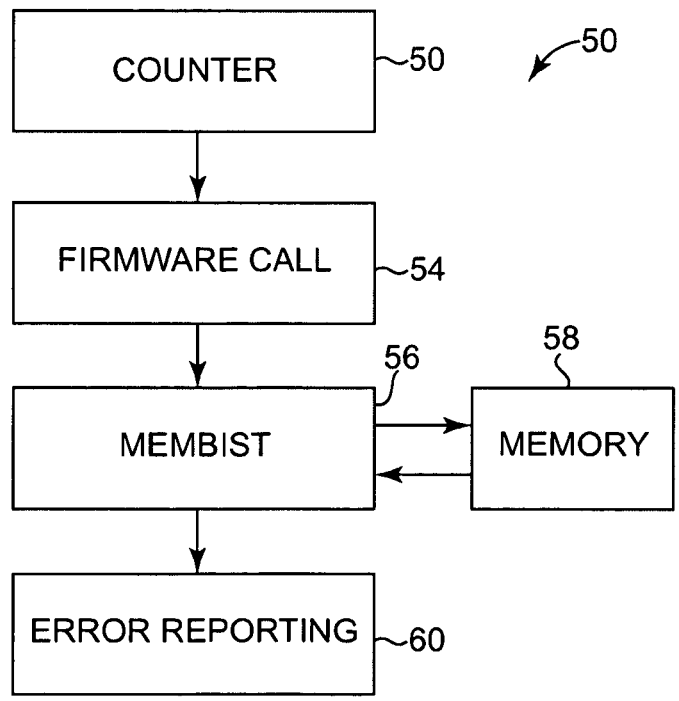
FIG. 3 is a block diagram of an example system of the present disclosure.

FIG. 3 illustrates an example system 52 suitable for performing the on-line memory test. A counter 52 is used to determine the existence of the pre-selected condition used to initiate the on-line memory test. The counter 52 can be a piece of hardware or can be implemented as a computer program. In the case of the counter as a computer program, the counter can be implemented as part of the firmware, operating system 30 or as another program operating on the computing platform 20. The counter 52 calls or interrupts the firmware 54, which then performs a routine to run the test 56 on the selected memory 58. The results of the test are reported and corrective action is taken 60.

In a particular example of the system 52, the operating system 30 includes the counter 52 that allows MEMBIST to test the spare DIMM or rank to be started with the pre-selected frequency. The system firmware 54, such as the boot monitor 28 contains a routine that is called by the operating system 30 to initiate MEMBIST to test the spare DIMM or rank. The routine will include the memory address range associated with the spare memory 34, the desired test pattern or patterns, and provide the mechanism for memory error reporting. In an example, some types of errors detected can be corrected by the memory controller. The errors are corrected, and error reporting in some examples includes only reporting uncorrectable errors. In the case of uncorrectable errors, the operating system can provide a warning that all or some of the spare memory can not be used. The spare DIMM or rank containing the uncorrectable errors will be disabled until the next scheduled system maintenance when the defective memory can be replaced.

FIG. 4 illustrates an example implementation of online memory testing. In this example, the memory controller or buffer 62 drives one or more registered or unbuffered DIMM channels 64 in lockstep. Standard memory 32 is not accessed while a test is running in order to avoid data bus contentions. Once the test has started for the spare memory, the operating system waits for the test to complete before sending regular memory transactions through the controller or buffer 62 to the DIMM channels 64. During the test, however, the controller or buffer 62 can send refresh commands to the standard memory to avoid data loss.

FIG. 5 illustrates another example implementation of the online memory testing where the memory technology is a Fully Buffered DIMM. The system memory 24 can include a standard memory 32 having a DIMM 66 and an associated Advanced Memory Buffer 68. The system memory can also include a spare memory 34 having a DIMM 70 and an associated Advanced Memory Buffer 72.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of performing on-line memory testing on a computing device having a processor and a memory, comprising:
   initiating the on-line memory testing, with a boot monitor included in a hardware of the computing device, wherein the on-line memory testing is initiated upon an occurrence of a pre-selected condition and wherein the memory includes a first address range including spare memory and a second address range currently storing functional data;
   determining the first address range with the processor;
   subjecting the first address range to a test data with the processor; and
   reporting errors in the first address range with the processor.

2. The method of claim 1 wherein the pre-selected condition is a passage of a period of time.

3. The method of claim 1 wherein the on-line memory includes standard memory in the second address range.

4. The method of claim 3 wherein the pre-selected condition includes that standard memory is at a threshold of errors.

5. The method of claim 3 wherein the first address range includes only the spare memory.

6. The method of claim 5 wherein the first address range includes a spare DIMM or spare rank of the spare memory.

7. The method of claim 6 wherein the test data is written to the spare DIMM or the spare rank.

8. The method of claim 1 wherein the test data is a destructive test including a stressful data pattern.

9. The method of claim 1 wherein the reporting errors includes repairing correctable errors and indicating uncorrectable errors.

10. A system for performing on-line memory testing, comprising:
    a memory system including standard and spare memory;
    a counter configured to determine a pre-selected condition; and a device including a firmware coupled to the counter such that the counter can call the device to initiate a memory test on the spare memory while the memory system is on-line.

11. The system of claim 10 wherein the memory system includes a plurality of non-volatile memory and the device includes a plurality of memory subsystem devices configured to drive data into the non-volatile memory, wherein one of the memory subsystem devices includes self test capabilities.

12. The system of claim 10 wherein the memory system includes a plurality of volatile memory and the device includes a plurality of memory subsystem devices configured to drive data into the volatile memory, wherein one of the memory subsystem devices includes self test capabilities.

13. The system of claim 10 wherein the memory system includes a plurality of dynamic random access memory and the device includes a plurality of memory subsystem devices configured to drive data into the dynamic random access memory, wherein one of the memory subsystem devices includes self test capabilities.

14. The system of claim 13 wherein the device is a memory controller and the memory system is registered, buffered, fully buffered, or unbuffered memory.

15. The system of claim 13 wherein the device is an advanced memory buffer and the memory system is a fully buffered dual in-line memory module.

16. The system of claim 13 wherein the self test capabilities include a memory built in self test.

17. A computing platform, comprising:
a system memory initialized as standard memory and spare memory;
a boot monitor included in the standard memory; and
a device containing a memory test configured to be initiated by the boot monitor, wherein the device is configured to operate the memory test on the spare memory while the system memory is on-line.

18. The computing platform of claim 17 wherein the system memory is a volatile memory.

19. The computing platform of claim 18 wherein the volatile memory is arranged in a memory module.

20. The computing platform of claim 17 wherein the device is one of a memory controller, a memory hub, or an advanced memory buffer.

* * * * *